United States Patent [19]
Kaneko et al.

[11] Patent Number: 5,167,778
[45] Date of Patent: Dec. 1, 1992

[54] ELECTROCHEMICAL ETCHING METHOD

[75] Inventors: Hiroyuki Kaneko, Yokohama; Makoto Uchiyama, Zushi; Hidetoshi Nojiri; Norihiko Kiritani, both of Yokosuka, all of Japan

[73] Assignee: Nissan Motor Co., ltd., Yokahama, Japan

[21] Appl. No.: 740,521

[22] Filed: Aug. 5, 1991

[30] Foreign Application Priority Data

Aug. 6, 1990 [JP] Japan .................................. 2-206808

[51] Int. Cl.$^5$ .............................................. C25F 3/12
[52] U.S. Cl. ................................................. 204/129.3
[58] Field of Search ......................... 204/129.3, 129.65

[56] References Cited

U.S. PATENT DOCUMENTS

| | | | |
|---|---|---|---|
| 3,616,348 | 10/1971 | Greig | 204/129.65 X |
| 3,640,807 | 1/1972 | Van Dijk et al. | 204/129.3 X |
| 3,853,650 | 12/1974 | Hartlaub | 204/129.3 X |
| 4,966,663 | 10/1990 | Mauger | 204/129.3 |
| 4,996,627 | 2/1991 | Zias et al. | 204/129.3 X |

FOREIGN PATENT DOCUMENTS 61-30038  2/1986  Japan .

OTHER PUBLICATIONS

Jackson et al., "An Electrochemical P-N Junction Etch-Stop for the Formation of Silicon Microstructures", IEEE Electron Device Letters, vol. EDL-2, Feb. 1981, pp. 44-45.
Gealer et al., "The Effect of an Interfacial P-N Junction on the Electrochemical Passivation of Silicon in Aqueous Ethylenediamine-Pyrocatechol"Journal of the Electrochemcial Society, May 1988, pp. 1180-1183.
Kloeck et al., "Study of Electrochemical Etch-Stop for High-Precision Thickness Control of Silicon Membranes", IEEE Transactions on Electron Devices, vol. 36, No. 4, Apr. 1989, pp. 663-669.

Primary Examiner—Donald R. Valentine

[57] ABSTRACT

An electrochemical etching method for producing semiconductor diaphragms from a semiconductor wafer comprised of a first semiconductor layer of a first conductivity type and a second semiconductor layer formed on the first semiconductor layer, the second semiconductor layer having a second conductivity type different than the first semiconductor layer. The semiconductor wafer is placed in an etching solution with respect to a counter-electrode immersed in the etching solution. The semiconductor wafer has a plurality of chips each of which includes at least one third semiconductor layer of the first conductivity type. The third semiconductor layer extends through the second semiconductor layer to the first semiconductor layer. A first positive potential is applied to the first and third semiconductor layers with respect to the counter-electrode. A second positive potential is applied to the second semiconductor layer with respect to the first semiconductor layer.

7 Claims, 7 Drawing Sheets

FIG.13A            FIG.13B

ELECTROCHEMICAL ETCHING METHOD

BACKGROUND OF THE INVENTION

This invention relates to an electrochemical etching method for producing semiconductor diaphragms from a semiconductor wafer comprised of a first semiconductor layer of given conductivity type and a second semiconductor layer, formed on the first semiconductor layer, of different conductivity type than the first semiconductor layer.

Various electrochemical etching methods have been proposed. Although the conventional electrochemical etching methods are satisfactory for general applications, they may not provide sufficiently accurate diaphragm thickness control in specialized applications, particularly where the semiconductor diaphragms have a complex structure having an aperture(s).

SUMMARY OF THE INVENTION

Therefore, a main object of the invention is to provide an improved electrochemical etching method applicable to produce semiconductor diaphragms having an aperture(s).

It is another object of the invention to provide an improved electrochemical etching method which can provide accurate diaphragm thickness control.

There is provided, in accordance with the invention, an electrochemical etching method for producing semiconductor diaphragms from a semiconductor wafer comprised of a first semiconductor layer of a first conductivity type and a second semiconductor layer formed on the first semiconductor layer, the second semiconductor layer having a second conductivity type different than the first semiconductor layer. The method comprises the steps of placing the semiconductor wafer in an etching solution with respect to a counter-electrode immersed in the etching solution, the semiconductor wafer having a plurality of chips each of which includes at least one third semiconductor layer of the first conductivity type, the third semiconductor layer extending through the second semiconductor layer to the first semiconductor layer, and applying a first positive potential to the first and third semiconductor layers with respect to the counter-electrode and a second positive potential to the second semiconductor layer with respect to the first semiconductor layer to etch the first and third semiconductor layers in the etching solution.

In another aspect of the invention, the electro-chemical etching method comprises the steps of placing the semiconductor wafer in an etching solution with respect to a counter-electrode immersed in the etching solution, the semiconductor wafer having a plurality of chips each of which includes at least one third semiconductor layer of the first conductivity type, the third semiconductor layer extending through the second semiconductor layer to the first semiconductor layer, and applying a first positive potential to the first semiconductor layer with respect to the counter-electrode, a second positive potential to the second semiconductor layer with respect to the first semiconductor layer, and a third positive potential to the third semiconductor layer with respect to the first semiconductor layer to etch the first and third semiconductor layers in the etching solution.

BRIEF DESCRIPTION OF THE DRAWINGS

This invention will be described in greater detail by reference to the following description taken in connection with the accompanying drawings, in which:

FIGS. 13A and 13B are sectional views showing different two states of the semiconductor wafer in the course of the conventional electrochemical etching process.

DETAILED DESCRIPTION OF THE INVENTION

Prior to the description of the preferred embodiment of the invention, the prior art electrochemical etching methods of FIGS. 6 to 13 are briefly described in order to provide a basis for a better understanding of the difficulties attendant thereon.

Figure 6:
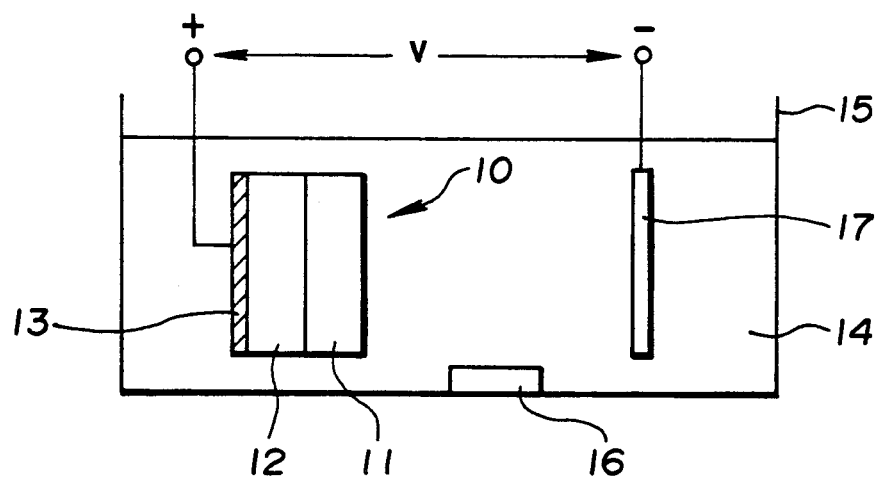
FIG. 6 is a sectional view showing a conventional electrochemical etching method.
Figure 7:
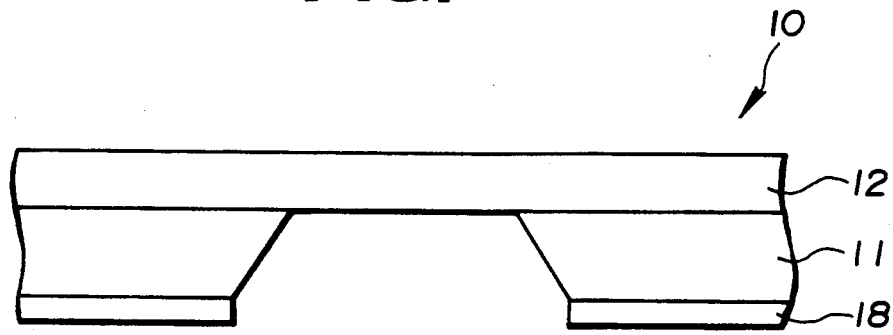
FIG. 7 is a fragmentary sectional view showing a semiconductor diaphragm produced by the conventional electrochemical etching method of FIG. 6.

In an article "IEEE ELECTRON DEVICE LETTERS, Vol. EDL-2, No. 2, pp. 44–45" published February 1981, there is described a conventional electrochemical etching method where a silicon wafer 10, which is comprised of a p-type silicon layer 11 and an n-type silicon layer 12 having a metal electrode 13 formed on its surface remote from the p-type silicon layer 11, is immersed in an etching solution 14 contained in a vessel 15 having a stir bar 16, as shown in FIG. 6. For example, the etching solution may a mixture of ethylenediamine, pyrocatechol and water. A positive potential is applied to the metal electrode 13 with respect to a platinum cathode 17 to start etching. As shown in FIG. 7, the silicon wafer 10 is patterned with a protective film 18 which insulates it from the etching solution. Etching stops when the n-type silicon layer 12 is exposed; that is, at the p-n junction. If the n-type silicon layer 12 is an n-type epitaxial layer grown on the p-type silicon substrate 11, the thickness of the diaphragm will be determined by the thickness of the epitaxial layer. It is, therefore, possible to provide high-accurate diaphragm thickness control with ease.

Figure 8:
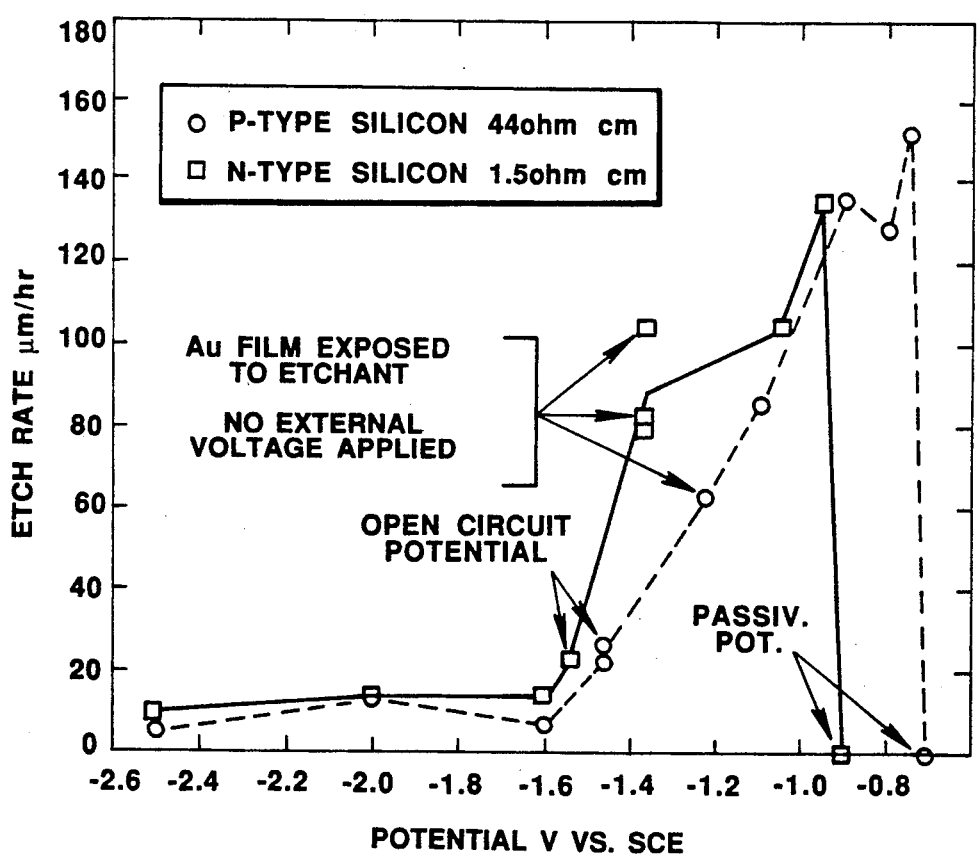
FIG. 8 is a graph showing the effect of potential on etch rate of silicon.

In an article published May 1988, in Journal of Electrochemical Society, Vol. 135, No. 5 by R. L. Gealer et al. entitled "The Effect of an Interfacial P-N Junction on the Electrochemical Passivation of Silicon in Aqueous Ethylenediamine-Pyrocatechol", there is described test results concerning the effect of electrochemical potential on etch rate for two materials, an n-type and a p-type silicon. The test results are shown in FIG. 8. As can be seen from FIG. 8, the etch rate increases as the potential applied to the silicon increases. Etching stops when the applied potential reaches a certain value which is referred to as passivation potential. The reason for this is as follows: The silicon is etched when the silicon is oxidized and the oxidized silicon is resolved in the etching solution. As the applied potential increases, the silicon is oxidized at a greater rate and the etch rate increases. Since the silicon is oxidized at an extremely high rate when the applied potential exceeds the passivation potential, an oxide film (passivation film) is formed on the surface of the silicon to stop etching. As can be seen from FIG. 8, the passivation potential is dependent upon the conductivity type of the silicon. For example, if the potential applied to the p-type silicon is less than its passivation potential and the potential applied to the n-type silicon is equal to or greater than its passivation potential, the p-type silicon will be etched while the n-type silicon will not be etched. When a positive potential is applied to an n-type silicone formed on a p-type silicon, as shown in FIG. 7, the n-type silicon will be protected from the etch if the positive potential is equal to or greater than the passivation potential for the n-type silicon. Since the potential applied to the inversely biased p-type silicon is less than its passivation potential, the p-type silicon is etched. Etching stops when the n-type silicon is exposed to the etching solution.

Figure 9A:
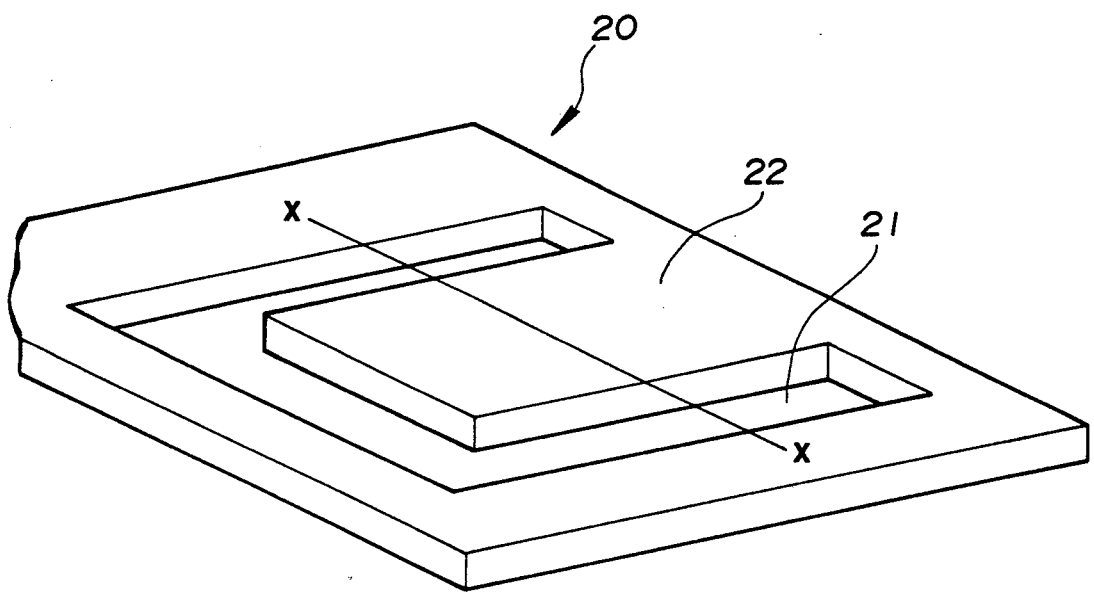
FIG. 9A is a fragmentary perspective view showing a diaphragm having an aperture formed therein to provide a cantilever.
Figure 9B:
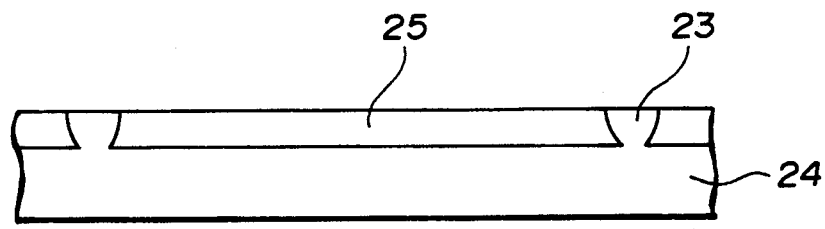
FIG. 9B is a sectional view showing a wafer chip structure from which the diaphragm of FIG. 9A is produced.

The above electrochemical etching method has been used in producing a complex diaphragm 20 having a U-shaped aperture 21 formed in the diaphragm 20 to provide a cantilever 22, as shown in FIG. 9A. This diaphragm may be produced using a diffusing technique to form a p-type silicon region 23 corresponding to the U-shaped aperture 21 in an n-type silicon layer 25 formed on a p-type silicon substrate 24, as shown in FIG. 9B. A positive potential, which is equal to or greater than the passivation potential for the n-type silicon, is applied to the n-type silicon layer 25 to etch the p-type silicon substrate 24 along with the p-type silicon diffused region 23.

Figure 10:
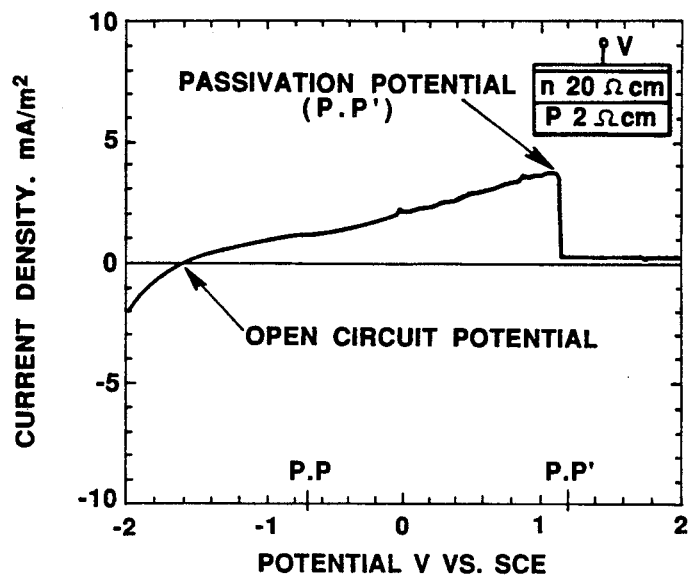
FIG. 10 is a graph showing a current-potential passivation curve.

In the above electrochemical etching methods, a positive potential is applied to the n-type silicon only to provide etch-stop at the p-n junction. However, it is not ensure that the p-type silicon is revolved at a potential above its passivation potential PP. Sometimes, the p-type silicon to be etched is not resolved at a potential PP' greater than the passivation potential PP. FIG. 10 shows a typical passivation curve for a p-type substrate with the voltage applied across an interfacial junction with an n-type epitaxial layer (Journal of Electrochemical Society", Vol. 135, No. 5). The resistivities of the p-type substrate and n-type epitaxial layer are 2 and 20 Ω·cm, respectively. Etching stops with the current being interrupted at a value PP' of about 1.2 volts. In this case, the etch-stop control can be made with ease since the difference between the passivation potential PP for the n-type epitaxial layer and the value PP' is relatively great. The difference is dependent upon the resistivities of the p-type substrate and n-type epitaxial layer. For example, the passivation potential PP is equal to −0.92 volts and the value PP' is equal to −0.93 volts where the p-type substrate has a resistivity of 0.011 Ω·cm and the n-type epitaxial layer has a resistivity of 2.5 Ω·cm. In this case, the difference between the passivation potential PP and the value PP' is too small to control etch-stop at the p-n junction. Furthermore, the current p-n junction has a great area sufficient to form mechanical microstructures such as cantilevers. For this reason, the p-n junction is subjective to a fault resulting in uncompleted junction. In this case, it is very difficult to provide a sufficient potential difference across the p-n junction.

Figure 11:
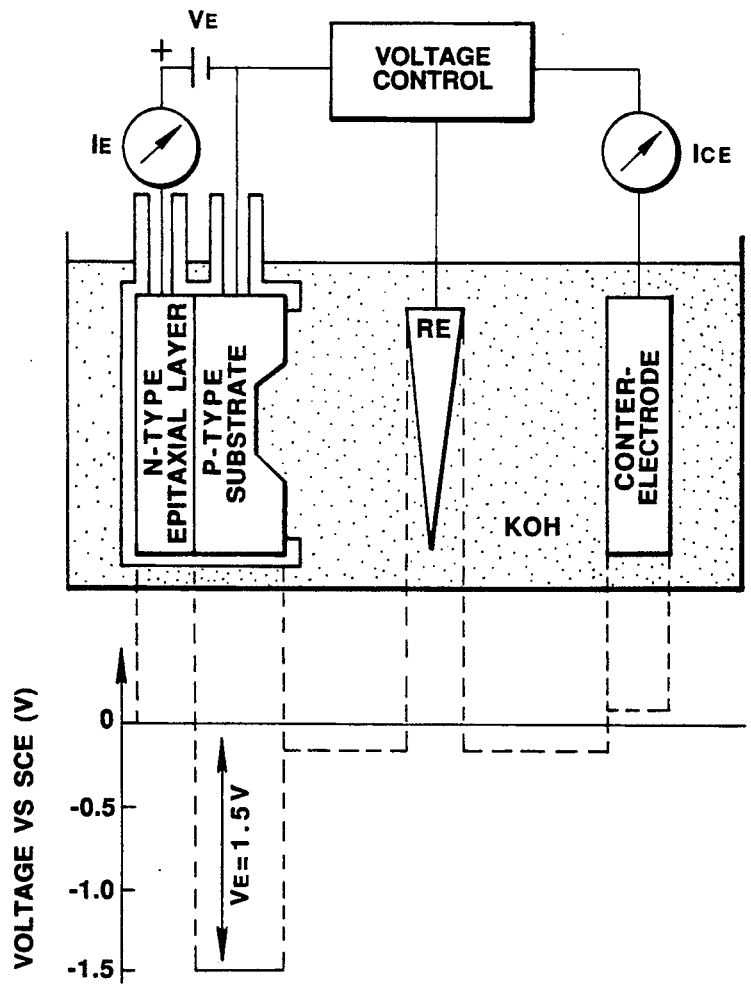
FIGS. 11 and 12 are schematic diagrams used in explaining another conventional electrochemical etching method.

It has been proposed to facilitate the etch-stop control by applying a bias voltage to the p-type silicon, as shown in FIG. 11. Etching is performed with a voltage (for example, −1.5 volts), which is much smaller than the passivation potential PP, to the p-type silicon and a voltage (for example, 0 volts) greater than the passivation potential PP to the n-type silicon. This approach ensure that etching stops at the p-n junction with minimized diaphragm thickness variations, as described in an article published April 1989, in IEEE TRANSACTIONS ON ELECTRON DEVICE, Vol. 36, No. 4, pp. 663-669 by Ben Kloeck et al. entitled "Study of Electrochemical Etch-Stop for High-Precision Thickness Control of Silicon Membranes".

Figure 12:
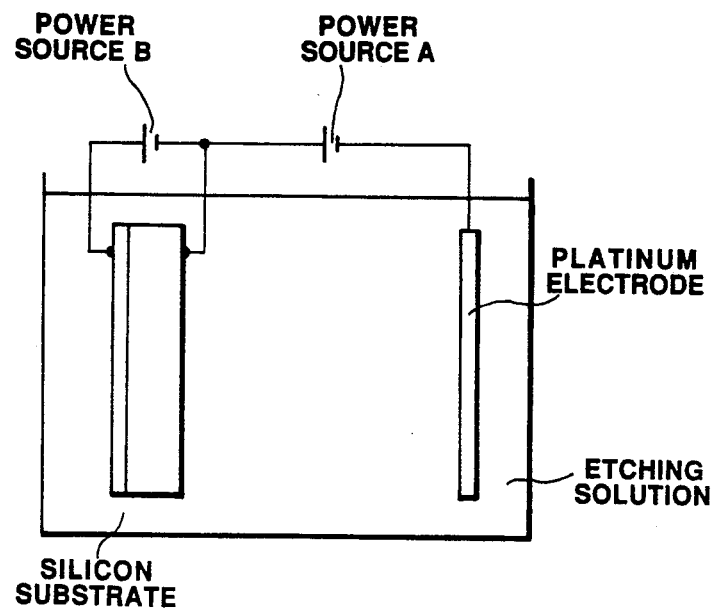
Figure 12:
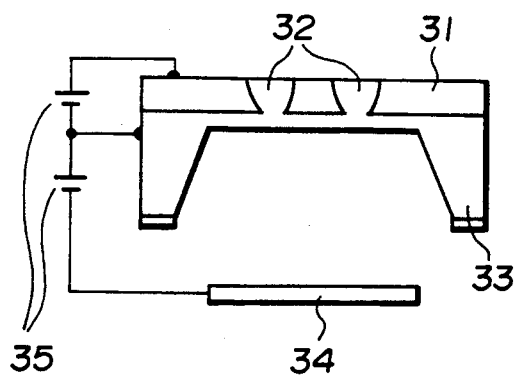
Figure 12:
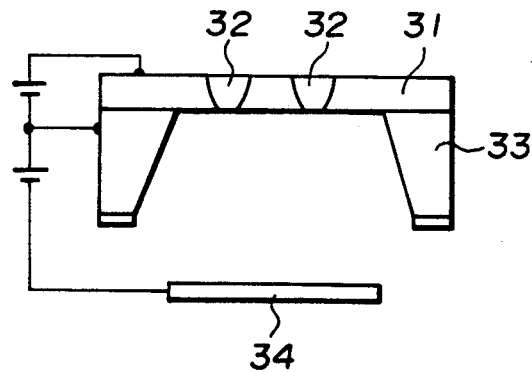

It has been proposed in Japanese Patent Kokai No. 61-30038 to increase the etched throughput by maintaining the p-type silicon at a potential between the open circuit potential OCP and the passivation potential PP to increase the etch rate as compared to the case where no bias voltage is applied to the p-type silicon, as shown in FIG. 12.

However, these conventional electrochemical etching methods where a bias voltage is applied to the p-type silicon substrate cannot be applied to form diaphragms having a U-shaped aperture as shown in FIG. 9A. The reason for this is that the p-type silicon region 23 (FIG. 9A) is not etched completely since it is always separated from the biased p-type silicon substrate 24 (FIG. 9) near the time at which etching is completed.

This difficulty associated with the conventional electrochemical etching methods will be described further in connection with FIGS. 13A and 13B. The p-type silicon substrate 33 is etched in a stable manner in the initial state of the etching process where the p-type silicon substrate 33 remains, as shown in FIG. 13A. When the p-type silicon substrate 33 is etched until the n-type silicon is exposed to the etching solution, as shown in FIG. 13B, the bias voltage applied to the p-type silicon 32 is interrupted. As a result, the p-type silicon 32 is not etched completely.

Figure 1:
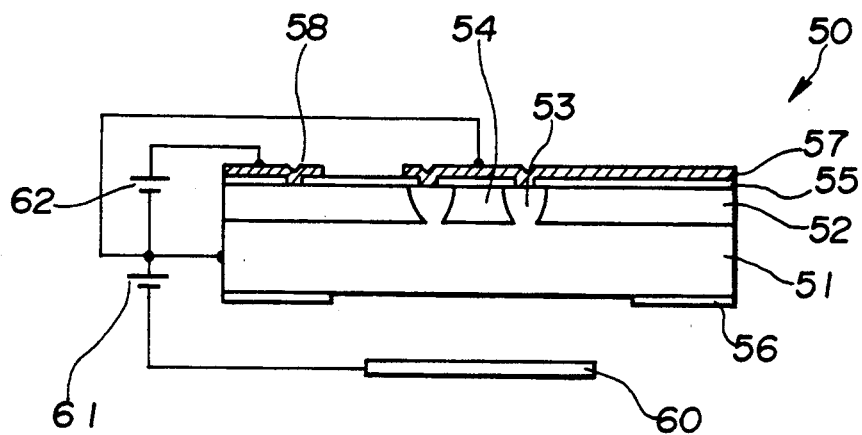
FIG. 1 is a sectional view used in explaining one embodiment of an electrochemical etching method made in accordance with the invention.

Referring to FIG. 1, one embodiment of an electrochemical etching method of the invention will be described. A semiconductor wafer, generally designated by the numeral 50, is comprised of a p-type silicon substrate 51, an n-type silicon layer (epitaxial layer) 52 formed on the silicon substrate 51. The semiconductor wafer 50 also includes a p-type diffused silicon region 53 formed in the n-type epitaxial layer 52 of each of a number of chips of the semiconductor wafer 50. The diffused silicon region 53, which extends through the n-type epitaxial layer 52 to the p-type silicon substrate 51, is to be etched to form an aperture in the n-type epitaxial layer 52 so as to provide a cantilever 54. An insulating layer 55 is provided on the surface of the n-type epitaxial layer 52 remote from the p-type silicon substrate 51. The insulating layer 55 serves as a mask for formation of the diffused silicon layer 53 in the n-type epitaxial layer 52. The semiconductor wafer 50 is patterned with an etch mask 56 on the surface of the p-type silicon substrate 51 remote from the n-type epitaxial layer 52 to protect it from the etch. A first electrode 57 is provided on the surface of the insulating layer 55 for connection to the p-type diffused silicon layer 53. A second electrode 58 is provided on the surface of the insulating layer 55 for connection to the n-type epitaxial layer 52.

The semiconductor wafer 50 is immersed in an etching solution with the p-type silicon substrate 51 facing to a counter-electrode 60 immersed in the etching solution. For example, the etching solution may be a KOH solution, an EDP solution containing ethylenediamine and pyrocatechol, $HF+H_2SO_4$, $NH_4$, or the like. Preferably, the first and second electrodes 57 and 58 are made of Al, Cr-Au, Pt or other metals not damaged by the etching solution. A first voltage source 61 has a negative terminal connected to the counter-electrode 60 and a positive terminal connected to the p-type silicon substrate 51 to maintain the p-type silicon substrate 51 at a first positive potential with respect to the counter-electrode 60. The first positive potential is sufficiently less than a passivation potential determined for the conductive type of the silicon substrate 51. The positive terminal of the first voltage source 61 is also connected to the first electrode 57 to maintain the p-type diffused silicon layer 53 at the first positive potential with respect to the counter-electrode 60. A second voltage source 62 has a negative terminal connected to the positive terminal of the first voltage source 61 and a positive terminal connected to the second electrode 58 to maintain the n-type epitaxial layer 52 at a second positive potential with respect to the counter-electrode 60. The second positive potential is sufficiently greater than a passivation potential determined for the conductivity type of the epitaxial layer 52.

Figures 2A, 2B:
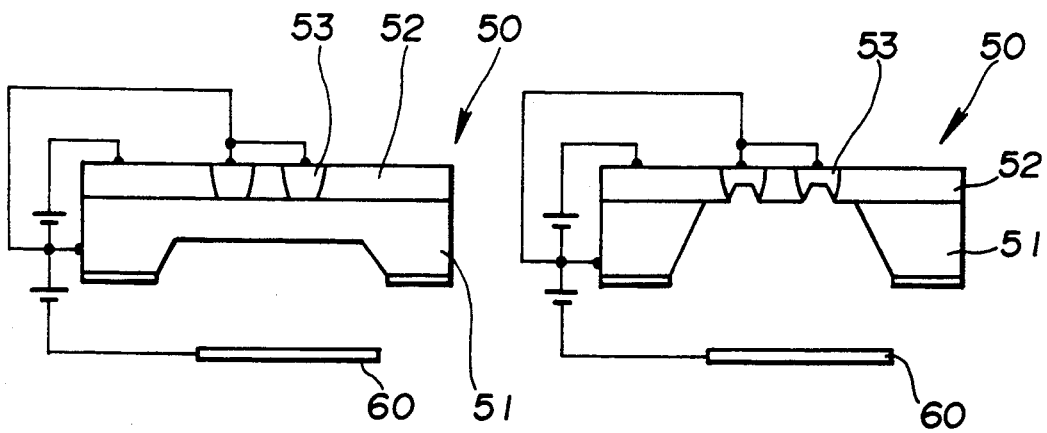
FIGS. 2A and 2B are schematic views showing different two states of the semiconductor wafer in the course of the electrochemical etching process.

FIG. 2A shows the semiconductor wafer 50 before the n-type epitaxial layer 52 is exposed to the etching solution. Since a bias voltage less than the passivation potential is applied to the p-type silicon substrate 51, the p-type silicon substrate 51 is etched normally. FIG. 2B shows the semiconductor wafer 50 having the p-type diffused silicon layer 53 etched partially after the n-type epitaxial layer 52 exposed to the etching solution. Since a voltage less than the passivation potential is applied to the p-type diffused silicon layer 53 always during the etching process, the p-type diffused silicon layer 53 are etched completely.

Figure 3:
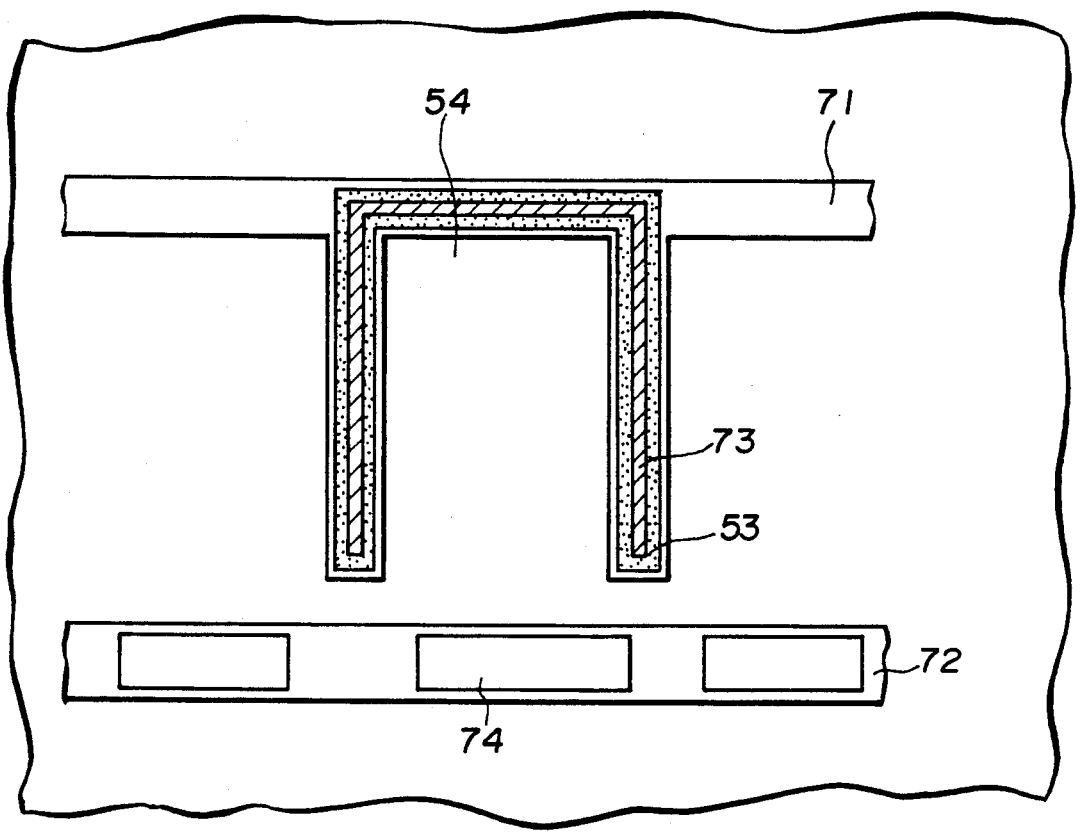
FIG. 3 is a fragmentary plan view of a semiconductor diaphragm produced by the electrochemical etching method of the invention.

FIG. 3 shows the positions of Al electrodes 71 and 72. The electrode 71 is used to apply the voltage to the p-type diffused silicon region 53 to be etched. The electrode 72 is used to apply the voltage to the n-type epitaxial layer 52 (FIG. 1). The numerals 73 and 74 designate contact regions.

Figure 4:
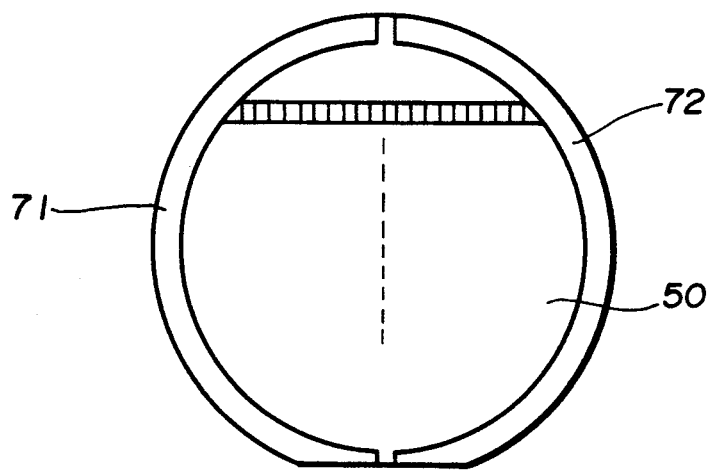
FIG. 4 is a plan view showing electrodes formed on a semiconductor wafer.

FIG. 4 shows the positions of the electrodes 71 and 72 placed on the semiconductor wafer 50 having a number of chips. Small electrodes, as shown in FIG. 3, are positioned on the semiconductor wafer 50 and connected to the electrodes 71 and 72.

Figure 5:
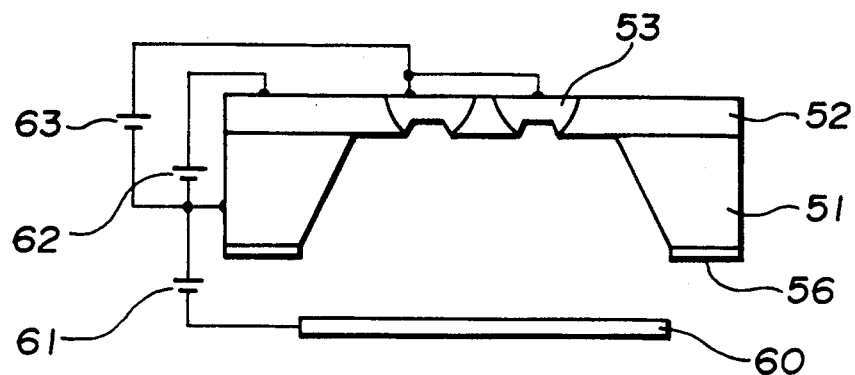
FIG. 5 is a sectional view used in explaining a second embodiment of the electrochemical etching method of the invention.

Referring to FIG. 5, there is shown a second embodiment of the first embodiment of the electrochemical etching method of the invention. This embodiment is substantially the same as the first embodiment of FIG. 1 except for a third voltage source 63 having a negative terminal connected to the positive terminal of the first voltage source 61 and a negative terminal connected to the p-type diffused silicon layer 53. The third voltage source 63 is effective to compensate a voltage drop which may be caused by a resistivity difference between the silicon substrate 51 and the diffused silicon region 53.

What is claimed is:

1. An electrochemical etching method for producing semiconductor diaphragms from a semiconductor wafer comprised of a first semiconductor layer of a first conductivity type and a second semiconductor layer formed on the first semiconductor layer, the second semiconductor layer having a second conductivity type different than the first semiconductor layer, the method comprising the steps of;

placing the semiconductor wafer in an etching solution with respect to a counter-electrode immersed in the etching solution, the semiconductor wafer having a plurality of chips each of which includes at least one third semiconductor layer of the first conductivity type, the third semiconductor layer extending through the second semiconductor layer to the first semiconductor layer; and applying a first positive potential to the first and third semiconductor layers with respect to the counter-electrode and a second positive potential to the second semiconductor layer with respect to the first semiconductor layer to etch the first and third semiconductor layers in the etching solution.

2. The electrochemical etching method as claimed in claim 1, wherein the first positive potential is applied to one side of the third semiconductor layer remote from the first semiconductor layer.

3. The electrochemical etching method as claimed in claim 2, wherein the second semiconductor layer is held at a potential greater than a passivation potential determined for the second conductivity type and the first and third semiconductor layers are held at a potential less than a passivation potential determined for the first conductivity type.

4. The electrochemical etching method as claimed in claim 1, wherein the third semiconductor layer is held at a positive potential with respect to the first semiconductor layer.

5. An electrochemical etching method for producing semiconductor diaphragms from a semiconductor wafer comprised of a first semiconductor layer of a first conductivity type and a second semiconductor layer formed on the first semiconductor layer, the second semiconductor layer having a second conductivity type different than the first semiconductor layer, the method comprising the steps of;

placing the semiconductor wafer in an etching solution with respect to a counter-electrode immersed in the etching solution, the semiconductor wafer having a plurality of chips each of which includes at least one third semiconductor layer of the first conductivity type, the third semiconductor layer extending through the second semiconductor layer to the first semiconductor layer; and applying a first positive potential to the first semiconductor layer with respect to the counter-electrode, a second positive potential to the second semiconductor layer with respect to the first semiconductor layer, and a third positive potential to the third semiconductor layer with respect to the first semiconductor layer to etch the first and third semiconductor layers in the etching solution.

6. The electrochemical etching method as claimed in claim 5, wherein the third positive potential is applied to one side of the third semiconductor layer remote from the first semiconductor layer.

7. The electrochemical etching method as claimed in claim 6, wherein the second semiconductor layer is held at a potential greater than a passivation potential determined for the second conductivity type and the first and third semiconductor layers are held at a potential less than a passivation potential determined for the first conductivity type.

* * * * *